United States Patent
Baker

(10) Patent No.: US 8,208,886 B2
(45) Date of Patent: Jun. 26, 2012

(54) METHOD AND SYSTEM FOR OPTIMIZING AN FM TRANSMITTER AND FM RECEIVER IN A SINGLE CHIP FM TRANSMITTER AND FM RECEIVER SYSTEM

(75) Inventor: Thomas Baker, Manhattan Beach, CA (US)

(73) Assignee: Broadcom Corporation, Irvine, CA (US)

( * ) Notice: Subject to any disclaimer, the term of this patent is extended or adjusted under 35 U.S.C. 154(b) by 781 days.

(21) Appl. No.: 11/832,590

(22) Filed: Aug. 1, 2007

(65) Prior Publication Data

US 2008/0232448 A1 Sep. 25, 2008

Related U.S. Application Data

(60) Provisional application No. 60/895,665, filed on Mar. 19, 2007.

(51) Int. Cl.
*H04B 1/06* (2006.01)
*H04K 3/00* (2006.01)
(52) U.S. Cl. ............... 455/277.1; 455/101; 343/860
(58) Field of Classification Search .............. 455/101, 455/107, 277.1–277.2, 552.1–553.1; 343/860, 343/861
See application file for complete search history.

(56) References Cited

U.S. PATENT DOCUMENTS

| | | | |
|---|---|---|---|
| 5,335,368 A * | 8/1994 | Tamura ................ | 455/575.7 |
| 6,529,746 B1 * | 3/2003 | Kotzin ................ | 455/562.1 |
| 6,643,497 B1 * | 11/2003 | Kouyama .............. | 455/83 |
| 7,493,152 B1 * | 2/2009 | Fifield ................ | 455/575.7 |
| 2004/0022210 A1 * | 2/2004 | Frank et al. ............ | 370/328 |
| 2006/0116092 A1 * | 6/2006 | Uno et al. ............. | 455/134 |
| 2006/0223577 A1 * | 10/2006 | Ouzillou .............. | 455/553.1 |

* cited by examiner

*Primary Examiner* — Lee Nguyen
(74) *Attorney, Agent, or Firm* — Thomas, Kayden, Horstmeyer & Risley, LLP

(57) ABSTRACT

Methods and systems for optimizing an FM transmitter and FM receiver in a single chip FM transmitter and receiver are disclosed and may include receiving an FM signal from each of multiple selected antenna configurations. The received signal strength obtained for each configuration may be measured and stored in a memory, and FM signals may be transmitted and/or received utilizing a configuration that generates a received signal strength above a desired threshold from the measurement. The FM transmitter and receiver may be integrated on-chip, and may be impedance matched to the antennas utilizing selectable capacitors integrated on-chip and/or off-chip and selectable inductors located off-chip. The multiple antennas may comprise antennas that are internal and antennas that are external to the wireless device, each of which may be tuned for one or more wireless protocols. One or more of the antennas may comprise metal components within the wireless device.

22 Claims, 9 Drawing Sheets

METHOD AND SYSTEM FOR OPTIMIZING AN FM TRANSMITTER AND FM RECEIVER IN A SINGLE CHIP FM TRANSMITTER AND FM RECEIVER SYSTEM

CROSS-REFERENCE TO RELATED APPLICATIONS/INCORPORATION BY REFERENCE

This application makes reference to and claims priority to U.S. Provisional Application Ser. No. 60/895,665, filed on Mar. 19, 2007, which is hereby incorporated herein by reference in its entirety.

This application also makes reference to:
U.S. patent application Ser. No. 11/832,598 filed on Aug. 1, 2007;
U.S. patent application Ser. No. 11/832,609 filed on Aug. 1, 2007;
U.S. patent application Ser. No. 11/832,468 filed on Aug. 1, 2007; and
U.S. patent application Ser. No. 11/832,488 filed on Aug. 1, 2007.

Each of the above stated applications is hereby incorporated herein by reference in its entirety.

FEDERALLY SPONSORED RESEARCH OR DEVELOPMENT

[Not Applicable]

MICROFICHE/COPYRIGHT REFERENCE

[Not Applicable]

FIELD OF THE INVENTION

Certain embodiments of the invention relate to wireless communication. More specifically, certain embodiments of the invention relate to a method and system for optimizing an FM transmitter and FM receiver in a single chip FM transmitter and FM receiver.

BACKGROUND OF THE INVENTION

With the increasing popularity of various wireless standards and technologies, there is a growing demand to provide a simple and complete solution for wireless communications applications. In this regard, electronics manufacturers are increasingly attempting to incorporate multiple wireless technologies into a single portable electronic device.

Although desirable to users, incorporating multiple wireless communication technologies into devices such as wireless handsets may pose problems in terms of cost and complexity. In this regard, combining a plurality of wireless technologies into a portable electronic device may require separate processing hardware and/or separate processing software. Moreover, coordinating the reception and/or transmission of data to and/or from the portable electronic device may require significant processing overhead that may impose certain operation restrictions and/or design challenges. For example, Bluetooth and Wireless LAN may pose certain coexistence problems caused by the close proximity of the Bluetooth and WLAN transceivers.

Furthermore, simultaneous use of a plurality of radios in a handheld communication device may result in significant increases in power consumption.

Further limitations and disadvantages of conventional and traditional approaches will become apparent to one of skill in the art, through comparison of such systems with the present invention as set forth in the remainder of the present application with reference to the drawings.

BRIEF SUMMARY OF THE INVENTION

A system and/or method for wireless communication, substantially as shown in and/or described in connection with at least one of the figures, as set forth more completely in the claims.

Various advantages, aspects and novel features of the present invention, as well as details of an illustrated embodiment thereof, will be more fully understood from the following description and drawings.

DETAILED DESCRIPTION OF THE INVENTION

Certain aspects of the invention may be found in a method and system for optimizing an FM transmitter and FM receiver in a single chip FM transmitter and receiver. Exemplary aspects of the invention may comprise receiving an FM signal from each of multiple selected antenna configurations. The received signal strength obtained for each of the antenna configurations may be measured, and FM signals may be transmitted and/or received utilizing an antenna configuration that generates a received signal strength above a desired threshold from the measurement. The received signal strength for each of the antenna configurations may be stored in a memory. The FM transmitter and receiver may be integrated on a chip. The FM receiver may be impedance matched to the antenna configurations utilizing selectable capacitors integrated on-chip and/or off-chip and selectable inductors located external to the chip. The plurality of antennas may comprise antennas that are internal to the wireless device and antennas that are external to the wireless device, each of which may be tuned for handling one or more of a plurality of wireless protocols. One or more of the plurality of antennas may comprise metal components within and/or part of an enclosure for the wireless device.

Figure 1A:
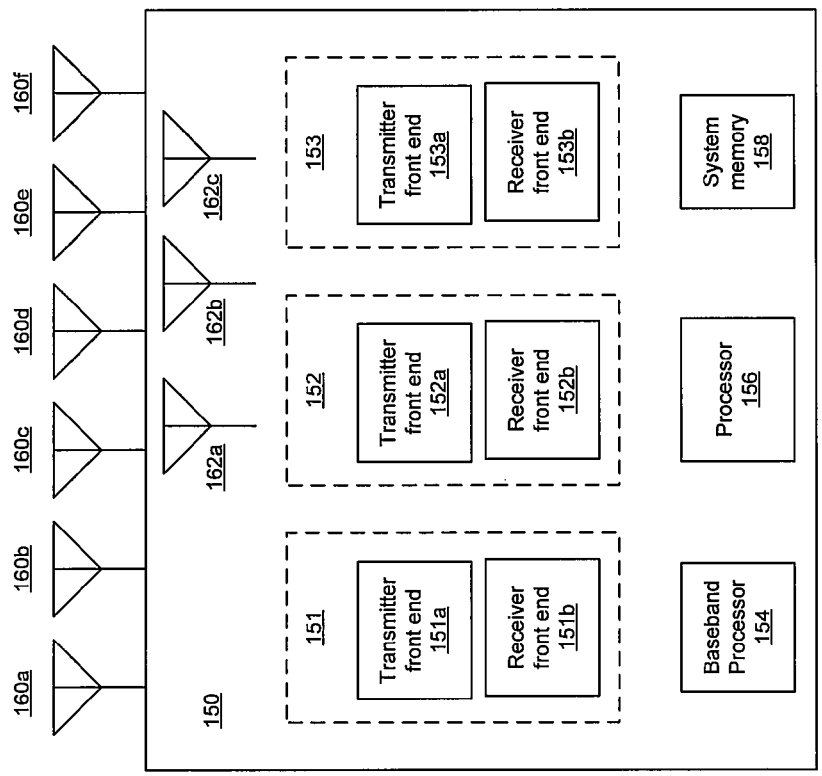
FIG. 1A is a block diagram of an exemplary system that enables multi-protocol communication, in accordance with an embodiment of the invention.

FIG. 1A is a block diagram of an exemplary system that enables multi-protocol communication, in accordance with an embodiment of the invention. Referring to FIG. 1A, there is shown a mobile terminal 150 comprising a plurality of transceivers 151, 152, and 153, a baseband processor 154, a processor 156, external antennas 160a-f, internal antennas 162a-c and system memory 158. The transceivers 151, 152, and 153 may each comprise a transmitter front end 151a, 152a, 153a, respectively, and a receiver front end 151b, 152b, 153b, respectively.

The transmitter front ends 151a, 152a, and 153a may comprise suitable circuitry, logic, and/or code that may be adapted to process and transmit RF signals. In an embodiment of the invention, the transmitter and receiver front ends for each wireless protocol may be integrated on a single chip. In another embodiment of the invention, each of the transceivers may be integrated on a single chip.

The external antennas 160a-f and the internal antennas 162a-c may comprise antennas that may be used for different wireless protocols, such as Bluetooth, NFC, WiFi and FM, for example. The internal antennas 162a-c may each comprise any metal component within the wireless communication device that may act as an antenna. One or more of the antennas may be selected to transmit and/or receive wireless signals. In an embodiment of the invention, a plurality of combinations of selected antennas may be switched on, and received signals may be measured and compared to assess the optimum antenna configuration at a particular frequency.

The transmitter front ends 151a, 152a, and 153a may receive baseband signals communicated by a baseband processor, such as, for example, the baseband processor 154. The signals may then be, for example, filtered, amplified, upconverted, and/or modulated for transmission. The baseband signal may be analog or digital depending on the functionality of the transmitter front end 151a, 152a, or 153a and the baseband processor 154.

The receiver front ends 151b, 152b, and 153b may comprise suitable circuitry, logic, and/or code that may be adapted to receive and process RF signals. The receiver front ends 151b, 152b, and 153b may amplify, filter, down-convert, and/or demodulate the received signals to generate a baseband signal. The baseband signal may be analog or digital depending on the functionality of the receiver front end 151b, 152b, or 153b and the baseband processor 154.

The baseband processor 154 is depicted as a single block for the sake of simplicity, however, the invention need not be so limited. For example, other embodiments of the invention may comprise a plurality of baseband processors for processing signals to and/or from the transceivers 151, 152, and 153.

The baseband processor 154 may comprise suitable circuitry, logic, and/or code that may be adapted to process received baseband signals from the receiver front ends 151b, 152b, and 153b. The baseband processor 154 also may comprise suitable logic, circuitry, and/or code that may be adapted to process a baseband signal for communication to the transmitter front ends 151a, 152a, and 153a.

The processor 156 may comprise suitable logic, circuitry, and/or code that may be adapted to control the operations of the transceivers 151, 152, and 153 and/or the baseband processor 154. For example, the processor 156 may be utilized to update and/or modify programmable parameters and/or values in a plurality of components, devices, and/or processing elements in the transceivers 151, 152, and 153 and/or the baseband processor 154. Control and/or data information may also be transferred to and/or from another controller and/or processor in the mobile terminal 150 to the processor 156. Similarly, the processor 156 may transfer control and/or data information to another controller and/or processor in the mobile terminal 150.

In operation, the processor 156 may utilize the received control and/or data information to determine a mode of operation for the transceivers 151, 152, and/or 153. For example, the processor 156 may control each of the receiver front ends 151b, 152b, and 153b to receive RF signals at a specific frequency. Similarly, the processor 156 may control each of the transmitter front ends 151a, 152a, and 153a to transmit RF signals at a specific frequency. The processor 156 may also adjust a specific gain for a variable gain amplifier, and/or adjust filtering characteristics for a filter. Moreover, a specific frequency selected and/or parameters needed to calculate the specific frequency, and/or the specific gain value and/or the parameters needed to calculate the specific gain, may be stored in the system memory 158 via the processor 156. This information stored in system memory 158 may be transferred to the receiver front end 152 from the system memory 158 via the processor 156. The system memory 158 may comprise suitable circuitry, logic, and/or code that may be adapted to store a plurality of control and/or data information, including parameters needed to calculate frequencies and/or gain, and/or the frequency value and/or gain value.

The wireless protocols transmitted and received by the mobile terminal 150 may comprise FM, WLAN, Bluetooth and near field communication (NFC), for example. The size of a system, such as a cellular phone with multi-protocol capability, may be greatly reduced if the radio functions for these protocols may be integrated onto a single chip. In addition, integrating a transmitter and a receiver for a particular wireless protocol on a single chip may enable configuration, calibration and performance optimization of a transceiver. For example, an integrated FM transmitter and FM receiver may enable optimized performance by using the FM transmitter to calibrate the FM receiver.

Figure 1B:
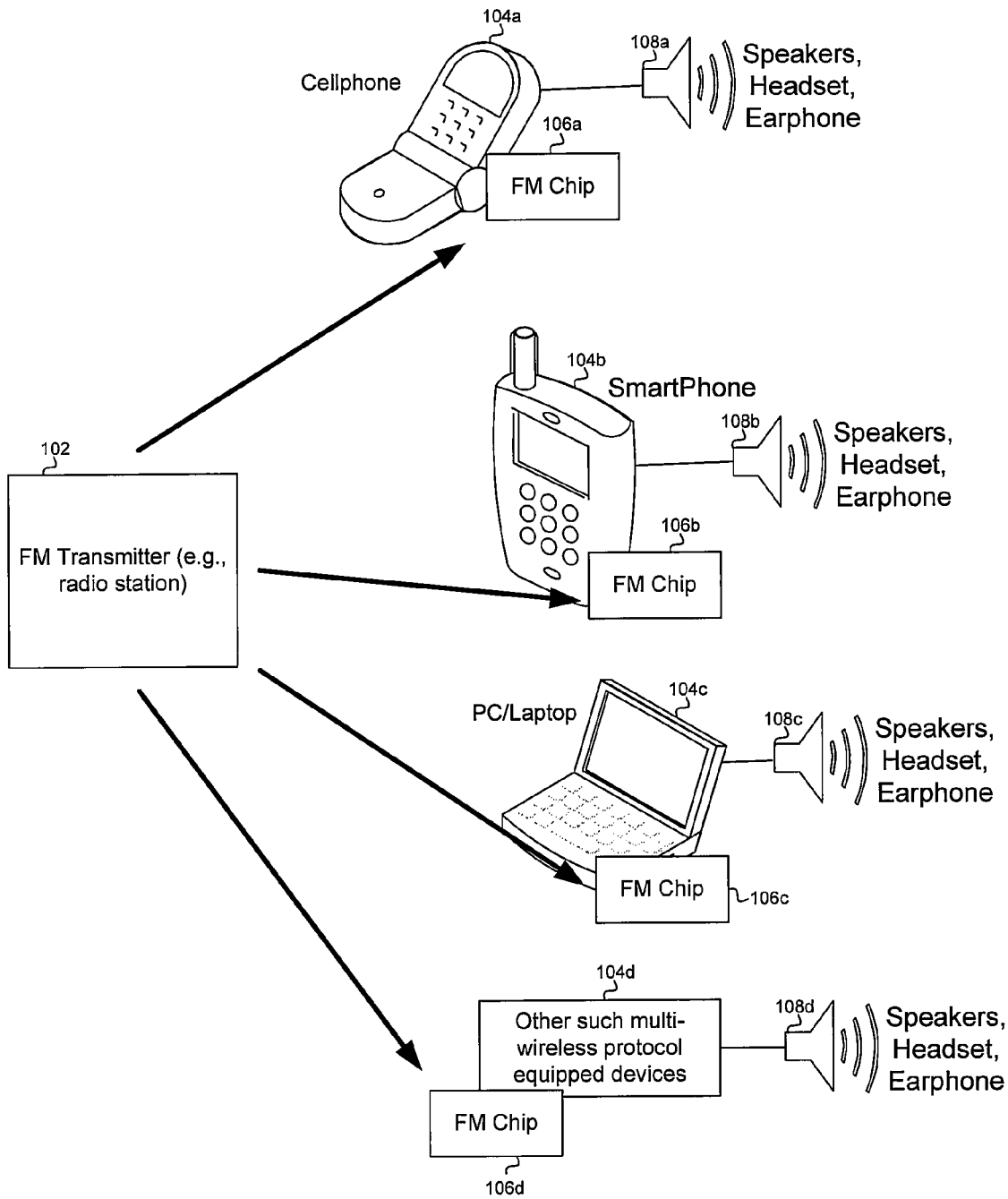
FIG. 1B is a block diagram of an exemplary FM transmitter that communicates with handheld devices that utilize a single chip with an integrated FM transmitter and receiver, in accordance with an embodiment of the invention.

FIG. 1B is a block diagram of an exemplary FM transmitter that communicates with handheld devices that utilize a single chip with an integrated FM transmitter and receiver, in accordance with an embodiment of the invention. Referring to FIG. 1B, there is shown an FM transmitter 102, a cellular phone 104a, a smart phone 104b, a computer 104c, and an exemplary multi-wireless protocol equipped device 104d. The FM transmitter 102 may be implemented as part of a radio station or other broadcasting device, for example. Each of the cellular phone 104a, the smart phone 104b, the computer 104c, and the exemplary multi-wireless protocol equipped device 104d may comprise a single chip 106a, 106b, 106c and 106d with an integrated FM transmitter and receiver. The FM transmitter 102 may enable communication of FM audio data to the devices shown in FIG. 1B by utilizing the single chip 106a, 106b, 106c and 106d in each device. Each of the devices in FIG. 1B may comprise and/or may be communicatively coupled to a listening device 108 such as a speaker, a headset, or an earphone, for example.

The cellular phone 104a may be enabled to receive an FM transmission signal from the FM transmitter 102. The user of the cellular phone 104a may then listen to the transmission via the listening device 108. The cellular phone 104a may comprise a "one-touch" programming feature that enables pulling up specifically desired broadcasts, like weather, sports, stock quotes, or news, for example. The smart phone 104b may be enabled to receive an FM transmission signal from the FM transmitter 102. The user of the smart phone 104b may then listen to the transmission via the listening device 108.

The computer 104c may be a desktop, laptop, notebook, tablet, and/or a PDA, for example. The computer 104c may be enabled to receive an FM transmission signal from the FM transmitter 102. The user of the computer 104c may then listen to the transmission via the listening device 108. The computer 104c may comprise software menus that configure listening options and enable quick access to favorite options, for example. In one embodiment of the invention, the computer 104c may utilize an atomic clock FM signal for precise timing applications, such as scientific applications, for example. While a cellular phone, a smart phone, computing devices, and other devices are shown in FIG. 1B, the single chip 106 may be utilized in a plurality of other devices and/or systems that receive and use multiple wireless protocols such as Bluetooth, NFC, WLAN, RFID and FM signals, for example.

Figure 1C:
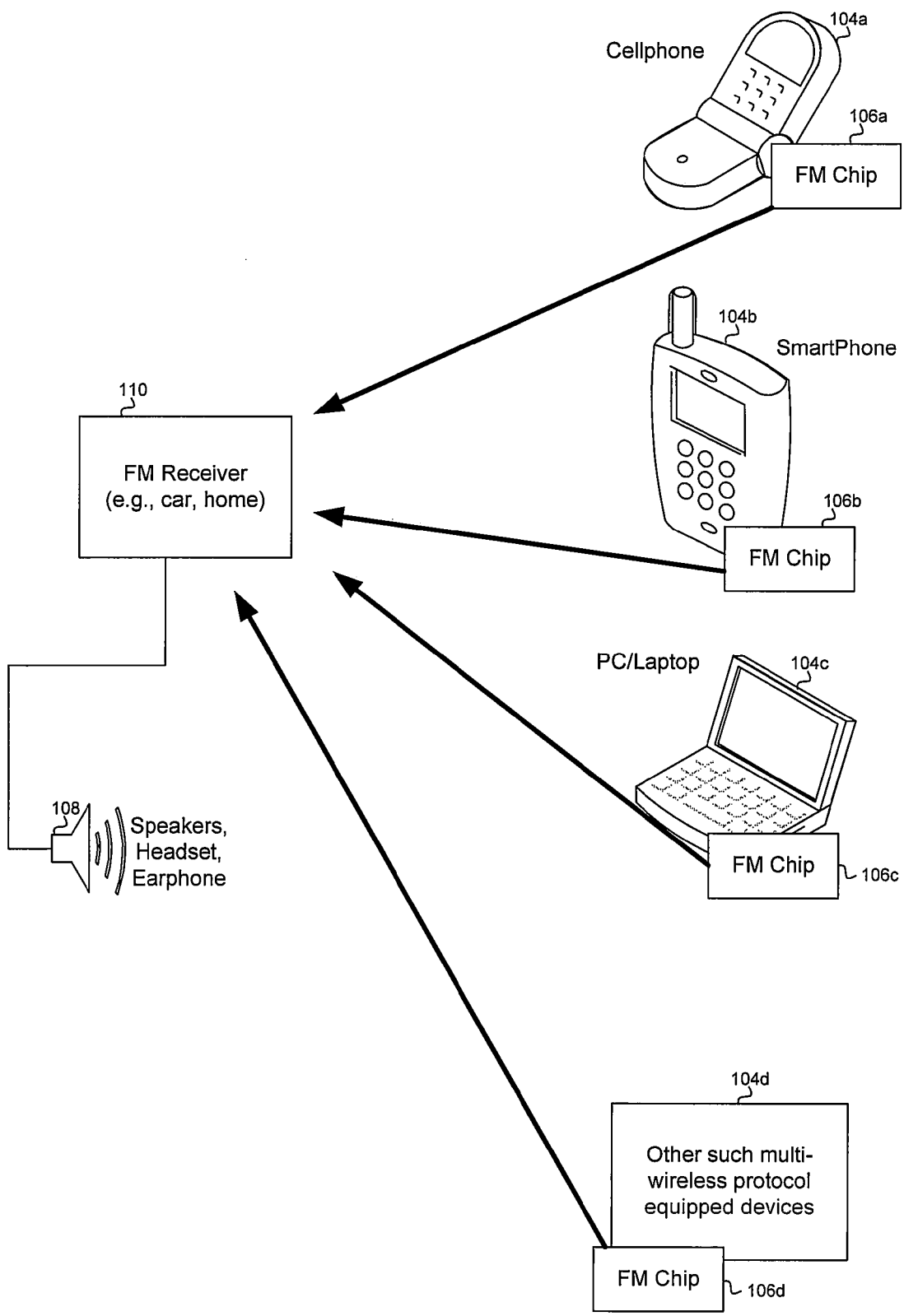
FIG. 1C is a block diagram of an exemplary FM receiver that communicates with handheld devices that utilize a single chip with an integrated FM transmitter and FM receiver in accordance with an embodiment of the invention.

FIG. 1C is a block diagram of an exemplary FM receiver that communicates with handheld devices that utilize a single chip with an integrated FM transmitter and FM receiver in accordance with an embodiment of the invention. Referring to FIG. 1C, there is shown an FM receiver 110, the cellular phone 104a, the smart phone 104b, the computer 104c, and the exemplary multi-wireless protocol equipped device 104d. In this regard, the FM receiver 110 may comprise and/or may be communicatively coupled to a listening device 108. A device equipped with an integrated FM transmitter and FM receiver, such as the single chip 106a, 106b, 106c or 106d, may be able to transmit or broadcast its respective signal to a "deadband" of an FM receiver for use by the associated audio system. For example, a cellphone or a smart phone, such as the cellular phone 104a and the smart phone 104b, may transmit a telephone call for listening over the audio system of an automobile, which may comprise the FM receiver 110 and the speakers 108, via usage of a deadband area of the car's FM stereo system. This may provide a universal capability to use this feature with all automobiles equipped simply with an FM radio with few, if any, other external FM transmission devices or connections being required.

In another example, a computer, such as the computer 104c, may comprise an MP3 player or another digital music format player and may broadcast a signal to the deadband of the FM receiver 110 which may be part of a home stereo system. The music on the computer 104c may then be listened to on a standard FM receiver, such as the FM receiver 110, with few, if any, other external FM transmission devices or connections. While a cellular phone 104a, a smart phone 104b, and computing device 106c are shown, a single chip that combines an FM transmitter and an FM receiver may be utilized in a plurality of other devices and/or systems that receive and use an FM signal.

Figure 1D:
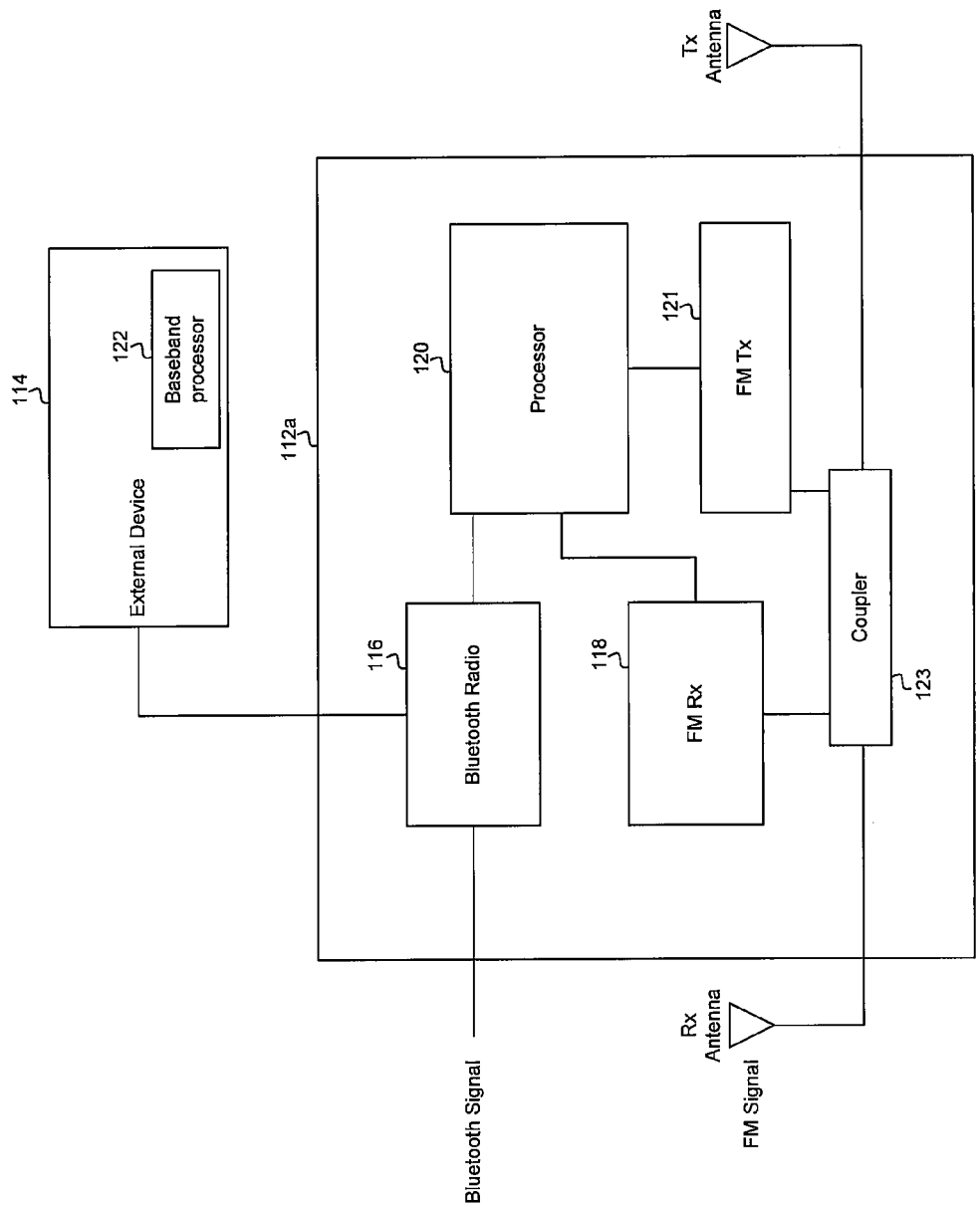
FIG. 1D is a block diagram of an exemplary single chip with integrated Bluetooth and FM Tx and FM Rx that supports FM processing and an external device that supports Bluetooth processing, in accordance with an embodiment of the invention.

FIG. 1D is a block diagram of an exemplary single chip with integrated Bluetooth and FM Tx and FM Rx that supports FM processing and an external device that supports Bluetooth processing, in accordance with an embodiment of the invention. Referring to FIG. 1D, there is shown a single chip 112a that supports Bluetooth and FM Tx and FM Rx operations and an external device 114. The single chip 112a may comprise an integrated Bluetooth radio 116, an integrated FM Rx 118, an integrated processor 120, a coupler 123 and an FM transmitter (Tx) 121. The Bluetooth radio 116 may comprise suitable logic, circuitry, and/or code that enable Bluetooth signal communication via the single chip 112a. In this regard, the Bluetooth radio 116 may support processing, playback and communication of audio signals. The FM radio may comprise suitable logic, circuitry, and/or code that enable FM signal communication via the single chip 112a.

The integrated processor 120 may comprise suitable logic, circuitry, and/or code that may enable processing of the FM data received by the FM Rx 118. Moreover, the integrated processor 120 may enable processing of FM data to be transmitted by the FM Rx 118 when the FM Rx 118 comprises transmission capabilities. The external device 114 may comprise a baseband processor 122. The baseband processor 122 may comprise suitable logic, circuitry, and/or code that may enable processing of Bluetooth data received by the Bluetooth radio 116. Moreover, the baseband processor 122 may enable processing of Bluetooth data to be transmitted by the Bluetooth radio 116. In this regard, the Bluetooth radio 116 may communicate with the baseband processor 122 via the external device 114. The Bluetooth radio 116 may communicate with the integrated processor 120. The FM transmitter 121 may comprise suitable logic, circuitry, and/or that may enable transmission of FM signals via appropriate broadcast channels, for example.

The coupler 123 may comprise suitable circuitry, logic and/or code for coupling the Rx and Tx antennas to the FM Rx 118 and the FM Tx 121. In this manner, each, or both antennae may be utilized to transmit and/or receive FM signals. A maximum transmit and/or received signal may be measured to determine an optimum antenna configuration.

Figure 1E:
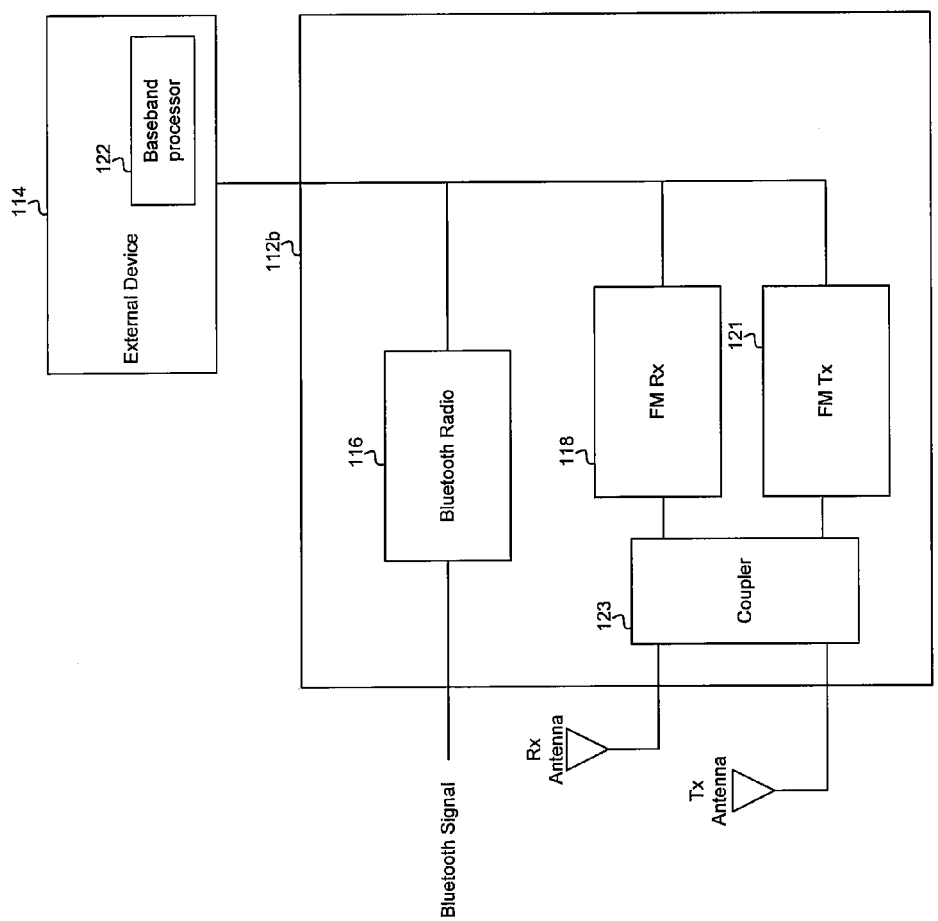
FIG. 1E is a block diagram of an exemplary single chip with integrated Bluetooth and FM radios and an external device that supports Bluetooth and FM processing, in accordance with an embodiment of the invention.

FIG. 1E is a block diagram of an exemplary single chip with integrated Bluetooth and FM radios and an external device that supports Bluetooth and FM processing, in accordance with an embodiment of the invention. Referring to FIG. 1D, there is shown a single chip 112b that supports Bluetooth and FM radio operations and an external device 114. The single chip 112b may comprise the Bluetooth radio 116, an FM Rx 118, a coupler 123 and an FM Tx 121. The Bluetooth radio 116 and/or the FM Rx 118 and FM Tx 121 may be integrated into the single chip 112b. The external device 114 may comprise a baseband processor 122.

The baseband processor 122 may comprise suitable logic, circuitry, and/or code that may enable processing of Bluetooth data received by the Bluetooth radio 116 and/or processing of Bluetooth data to be transmitted by the Bluetooth radio 116. In this regard, the Bluetooth radio 116 may communicate with the baseband processor 122 via the external device 114. Moreover, the baseband processor 122 may comprise suitable logic, circuitry, and/or code that may enable processing of the FM data received by the FM Rx 118. The baseband processor 122 may enable processing FM data to be transmitted by the FM Tx 121. In this regard, the FM Rx 118 and FM Tx 121 may communicate with the baseband processor 122 via the external device 114. The coupler may be substantially similar to the coupler 123 described with respect to FIG. 1D, and may be enabled to select antennas for transmission and reception, such that either antenna may be used for transmission and/or reception. An optimum configuration may be determined by measuring a maximum transmit and/or receive signal strength.

Figure 1F:
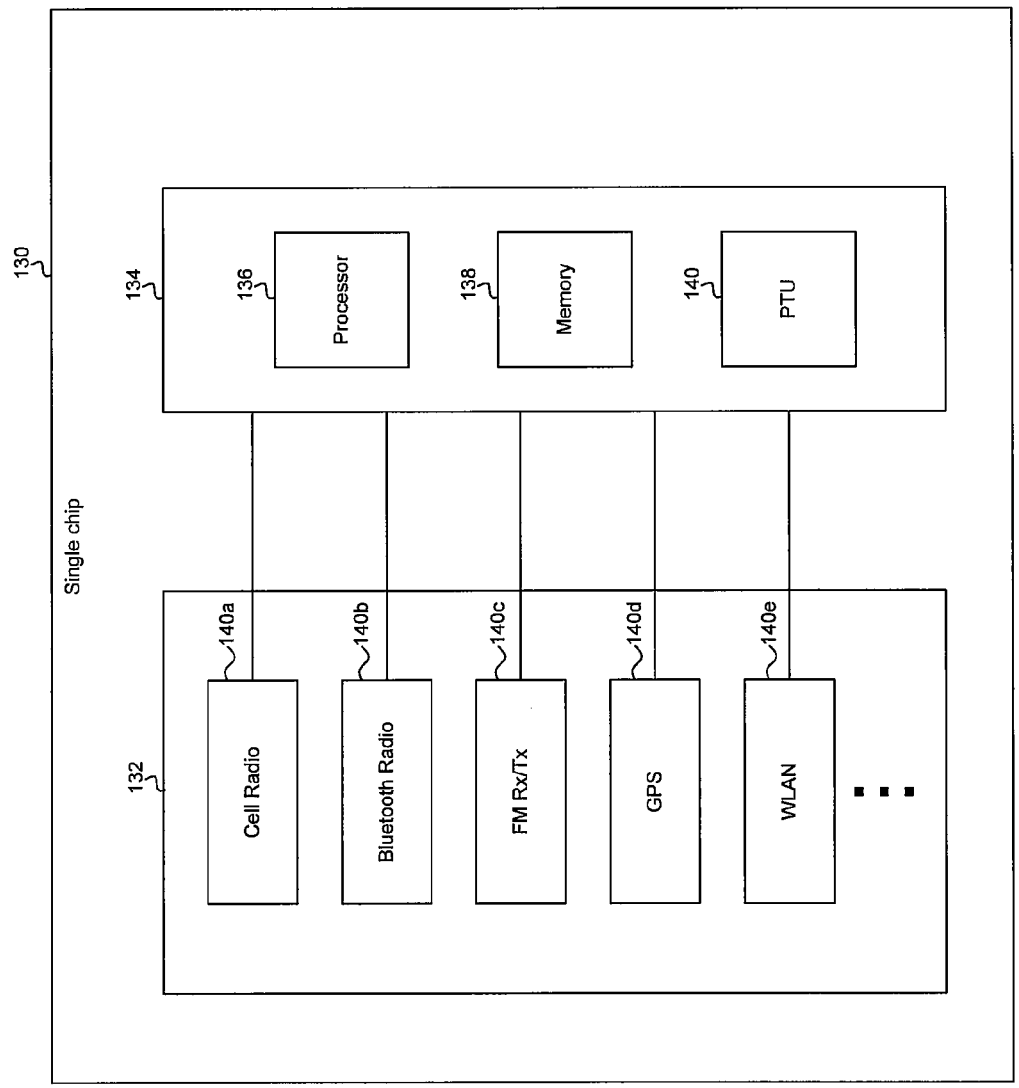
FIG. 1F is a block diagram of an exemplary single chip with multiple integrated radios that supports radio data processing, in accordance with an embodiment of the invention.

FIG. 1F is a block diagram of an exemplary single chip with multiple integrated radios that supports radio data processing, in accordance with an embodiment of the invention. Referring to FIG. 1F, there is shown a single chip 130 that may comprise a radio portion 132 and a processing portion 134. The radio portion 132 may comprise a plurality of integrated radios. For example, the radio portion 132 may comprise a cell radio 140a that supports cellular communications, a Bluetooth radio 140b that supports Bluetooth communications, an FM receive and transmit (Rx/Tx) radio 140c that supports FM communications, a global positioning system (GPS) 140d that supports GPS communications, and/or a wireless local area network (WLAN) 140e that supports communications based on the IEEE 802.11 standards.

The processing portion 134 may comprise at least one processor 136, a memory 138, and a peripheral transport unit (PTU) 140. The processor 136 may comprise suitable logic, circuitry, and/or code that enable processing of data received from the radio portion 132. In this regard, each of the integrated radios may communicate with the processing portion 134. In some instances, the integrated radios may communicate with the processing portion 134 via a common bus, for example. The memory 138 may comprise suitable logic, circuitry, and/or code that enable storage of data that may be utilized by the processor 136. In this regard, the memory 138 may store at least a portion of the data received by at least one of the integrated radios in the radio portion 132. Moreover, the memory 138 may store at least a portion of the data that may be transmitted by at least one of the integrated radios in the radio portion 132. The PTU 140 may comprise suitable logic, circuitry, and/or code that may enable interfacing data in the single chip 130 with other devices that may be communicatively coupled to the single chip 130. In this regard, the PTU 140 may support analog and/or digital interfaces.

By integrating the FM Tx and FM Rx functions on a single chip, an optimum antenna configuration may be determined by measuring a received signal utilizing a plurality of antenna configurations. By reciprocity, the antenna configuration which results in the maximum received signal strength may be utilized to generate the maximum transmitted signal strength.

Figure 2:
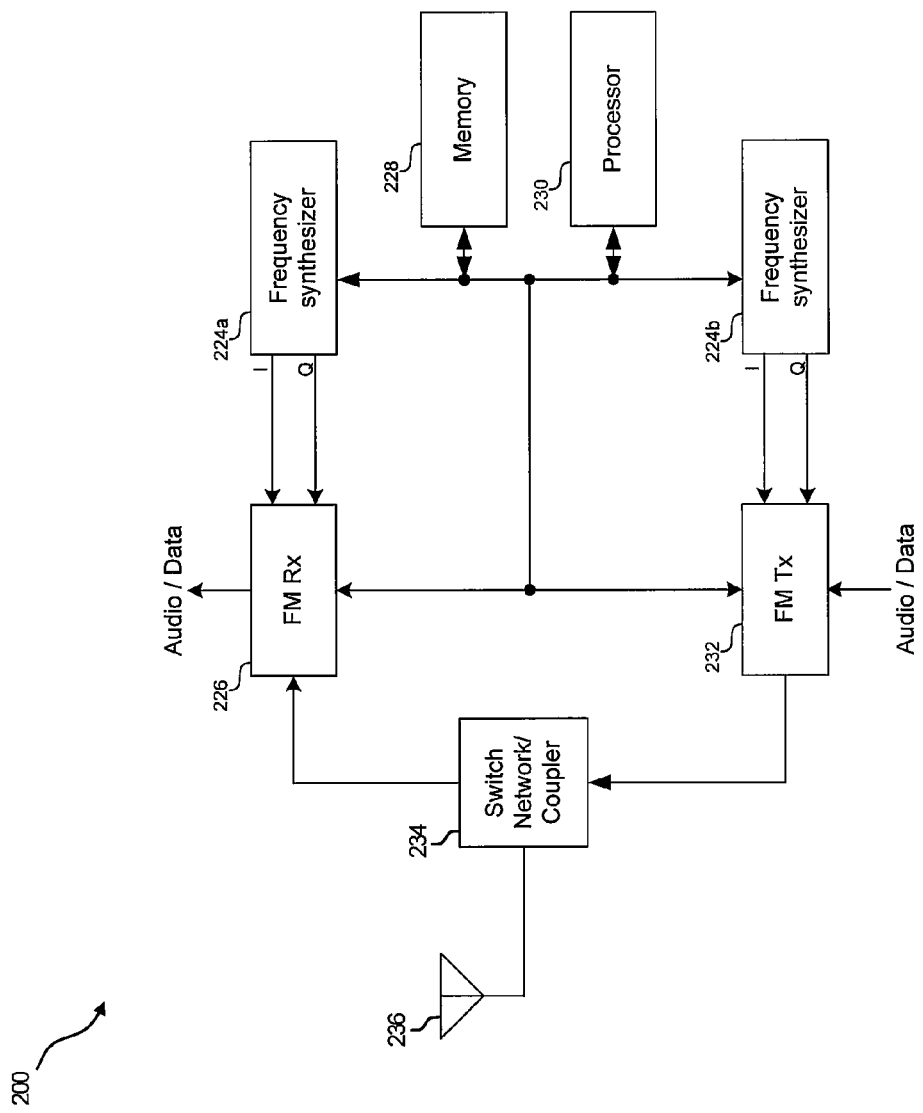
FIG. 2 is a block diagram of an exemplary system for FM transmission and reception, in accordance with an embodiment of the invention.

FIG. 2 is a block diagram of an exemplary system for FM transmission and reception, in accordance with an embodiment of the invention. Referring to FIG. 2, the radio 200 may comprise two frequency synthesizers 224a and 224b, an FM receive (Rx) block 226, a memory 228, a processor 230, a switch network/coupler 234, an antenna block 236 and an FM transmit (Tx) block 232.

The frequency synthesizers 224a and 224b may comprise suitable circuitry, logic, and/or code that may enable generation of fixed or variable frequency signals. For example, the frequency synthesizers 224a and 224b may each comprise one or more direct digital frequency synthesizers, along with a clock source, such as a Bluetooth or RFID phase-locked loop (PLL) clock generator.

The memory 228 may comprise suitable circuitry, logic, and/or code that may enable storing information. In this regard, the memory 228 may, for example, enable storing information utilized for controlling and/or configuring the frequency synthesizers 224a and 224b. For example, the memory 228 may store the value of state variables that may be utilized to control the frequency output by each of the frequency synthesizers 224a and 224b. Additionally, the memory 228 may enable storing information that may be utilized to configure the FM Rx block 226 and the FM Tx block 232. In this regard, the FM Rx block 226 and/or the FM Tx block 232 may comprise circuitry, logic, and/or code such as a filter, for example, that may be configured based on the desired frequency of operation.

The processor 230 may comprise suitable circuitry, logic, and/or code that may enable interfacing to the memory 228, the frequency synthesizers 224a and 224b, the FM Rx block 226 and/or the FM Tx block 232. In this regard, the processor 230 may be enabled to execute one or more instructions that enable reading and/or writing to/from the memory 228. Additionally, the processor 230 may be enabled to execute one or more instructions that enable providing one or more control signals to the frequency synthesizer 224, the FM Rx block 226, and/or the FM Tx block 232.

The FM Rx block 226 may comprise suitable circuitry, logic, and/or code that may enable reception of FM signals. In this regard, the FM Rx block 226 may be enabled to tune to a desired channel, amplify received signals, down-convert received signals, and/or demodulate received signals to, for example, output data and/or audio information comprising the channel. For example, the FM Rx block 226 may utilize in-phase and quadrature local oscillator signals generated by the frequency synthesizer 224a to down-convert received FM signals. The FM Rx block 226 may, for example, be enabled to operate over the "FM broadcast band", or approximately 76 MHz to 108 Mhz. Signal processing performed by the FM Rx block 226 may be performed in the analog domain or the digital domain. In this regard, the FM Rx block 226 may comprise one or more analog to digital converters (ADCs) and/or digital to analog converters (DACs) which may enable processing in the analog and/or digital domain.

The FM Tx block 232 may comprise suitable circuitry, logic, and/or code that may enable transmission of FM signals. In this regard, the FM Tx block 232 may enable frequency modulation of a carrier signal with audio/data information. In this regard, the carrier frequency may be generated by the clock frequency synthesizer 224b. The FM Tx block 232 may also enable up-converting a modulated signal to a frequency, for example, in the "FM broadcast band", or approximately 76 MHz to 108 Mhz. Additionally, the FM Tx block 232 may enable buffering and/or amplifying a FM signal such that the signal may be transmitted via an antenna. In another embodiment of the invention, the frequency synthesizer 224b may comprise a DDFS that may be capable of providing FM modulation for the signal to be transmitted.

The switch network/coupler 234 may comprise suitable circuitry, logic and or code that may enable coupling the FM Tx block 232 and the FM Rx block 226 to the antenna block 236 for the transmission and reception of wireless signals. In an embodiment of the invention, the antenna block 236 may comprise a plurality of antennas. In this case, the switch network/coupler 234 may couple the FM Tx block 232 and the FM Rx block 226 to the plurality of antennas. The plurality of antennas may comprise internal and externally coupled antennas, or even various metal components within the housing which may contain the radio 200 or even metal components of the housing itself.

In an exemplary operation of the system 200, one or more signals provided by the processor 230 may configure the system 200 to transmit and/or receive FM signals. To receive FM signals, the processor 230 may provide one or more control signals to frequency synthesizers 224a and 224b in order to generate appropriate LO frequencies based on the reference signal $f_{ref}$. In this regard, the processor may interface to the memory 228 in order to determine the appropriate state of any control signals provided to the frequency synthesizers 224a and 224b. In this manner, the transmit frequency and receive frequency may be determined independently. Accordingly, utilizing a transmit frequency different from the receive frequency may enable simultaneous transmission and reception of FM signals.

The switch network/coupler 234 may be utilized to configure the antenna 236 which may comprise one or more antennas. A plurality of antenna configurations may be configured to determine the configuration that results in the strongest received signal measured. In this manner, the optimum transmitted and received signal may be obtained, and is described further with respect to FIG. 4.

Figure 3:
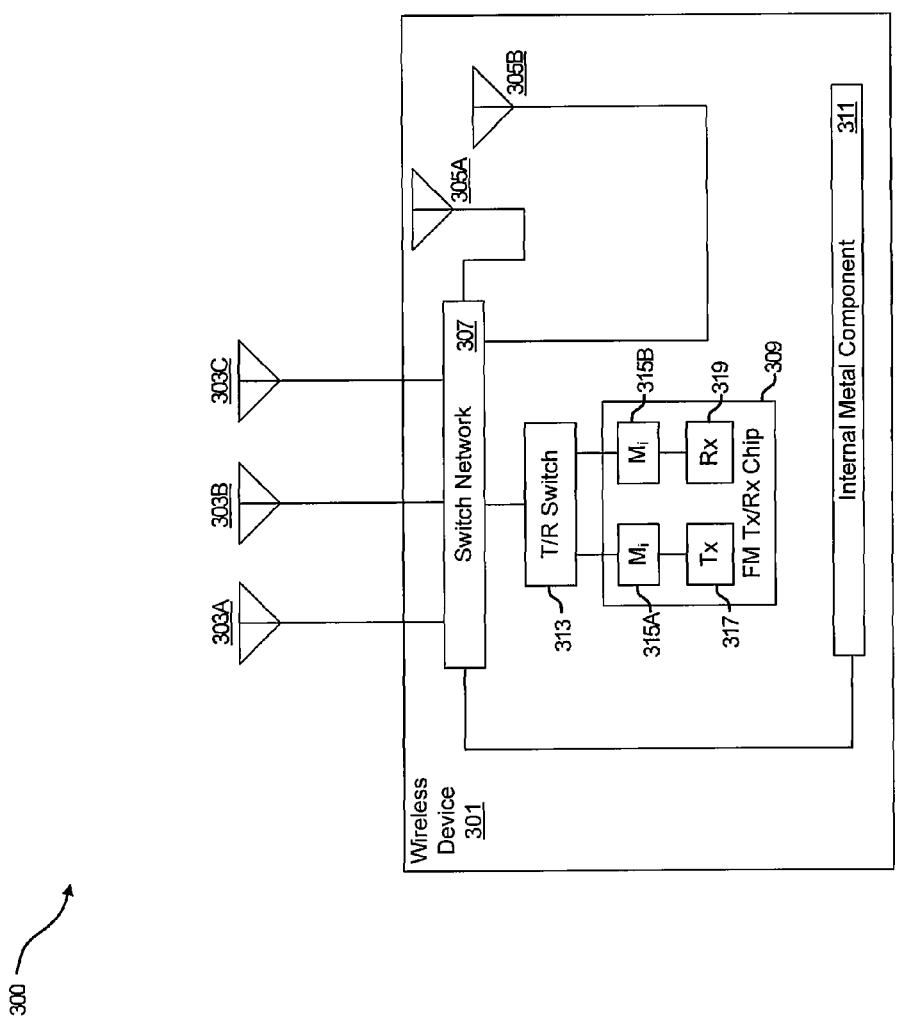
FIG. 3 is a block diagram illustrating an exemplary wireless device incorporating multiple antennas, in accordance with an embodiment of the invention.

FIG. 3 is a block diagram illustrating an exemplary wireless device incorporating multiple antennas, in accordance with an embodiment of the invention. Referring to FIG. 3, there is shown a wireless system 300 comprising a wireless device 301 and external antennas 303A, 303B and 303C. The wireless device 301 may comprise internal antennas 305A and 305B, a switch network 307, an FM transmit/receive (Tx/Rx) chip 309, a T/R switch 313 and an internal metal component 311. The FM Tx/Rx chip 309 may comprise on-chip impedance matching blocks 315A and 315B, an FM transmit (Tx) block 317 and an FM receive (Rx) block 319.

The external antennas 303A, 303B and 303C may comprise externally coupled antennas that each may be enabled for transmitting and receiving a signal conforming to a particular wireless protocol, such as Bluetooth, RFID, and/or FM, for example. The internal antennas 305A and 305B may similarly be enabled for transmitting and receiving a signal conforming to a particular wireless protocol, and may be located internal to the case enclosing the wireless device 301.

The internal metal component 311, may comprise a metal component located within and/or part of the wireless device enclosure, which when coupled to one or more of the antennas may alter the transmit/receive characteristics, such as transmitted and/or received power, for example, of the coupled one or more antennas. The number of internal metal components may not be limited to the number shown in FIG. 3. Accordingly, the wireless device 301 may comprise any number, or even all of the internal metal components that may affect the Tx/Rx characteristics of the system. The internal metal component 311 or components may be utilized in instances where the transmit/receive characteristics may be improved, such as in the transmission and/or reception of FM signals where the increased size of the antenna may increase signal strength.

The FM Tx/Rx chip 309 may comprise suitable circuitry, logic and/or code that may enable transmission and reception of FM signals. The FM Tx block 317 may comprise suitable circuitry, logic and/or code that may enable transmission of FM signals via the switch network 307 and selected one or more of the external antennas 303A, 303B, 303C, and/or one or more of the internal antennas 305A and 305B. In the same manner, the FM Rx block 319 may comprise suitable circuitry, logic and/or code that may enable reception of FM signals over the same selected antennas.

The on-chip impedance matching blocks 315A and 315B may comprise suitable circuitry, logic and/or code that may enable impedance matching of the FM Tx block 317 and the FM Rx block 319, respectively, in conjunction with off-chip impedance matching components within the T/R switch 313, with the selected one or more antennas. The on-chip impedance matching blocks 315A and 315b may comprise selectable capacitors of varying capacitance values, for example, such that the impedance matching may be performed at various frequencies and/or with multiple antenna configurations. Additionally, selectable capacitors may be located off-chip for impedance matching.

The switch network 307 may comprise suitable circuitry, logic and/or code that may enable selection of one or more of the antennas and metal components that may be utilized to transmit and receive FM signals. The switch network may be controlled by a processor, such as the processor 230, described with respect to FIG. 2. The switch network 307 may couple one or more of the antennas comprising the external antennas 303A, 303B, 303C, and/or one or more of the internal antennas 305A and 305B, as well as one or more metal components, such as the internal metal component 311 to the T/R switch 307. The internal and external antennas and internal metal component or components may be connected in series or parallel to obtain multiple antenna configurations.

The T/R switch 313 may comprise suitable circuitry, logic and/or code that may enable switching the selected antenna configuration to be coupled with the FM Tx block 317 and/or the FM Rx block 319. The T/R switch 313 may also comprise circuitry that may enable impedance matching, in conjunction with the on-chip impedance matching blocks 315A and 315B, of the FM Tx block 317 and/or the FM Rx block 319 to the selected antenna configuration. The impedance matching circuitry incorporated with the T/R switch 313 may comprise selectable inductors of varying inductance values, for example, such that the impedance matching may be performed at various frequencies and/or with multiple antenna configurations. In another embodiment of the invention, in instances where the FM Tx/Rx chip 309 may be capable of simultaneous FM transmission and reception, as described with respect to FIG. 2, the T/R switch may be enabled to couple both the Tx block 317 and the Rx block 319 to the selected antenna configuration.

In operation, the FM Tx block 317 may be enabled to generate an FM signal to be transmitted by the internal and/or external antennas selected by the switch network 307. The on-chip impedance matching block 315A may be enabled to match the output impedance of the FM Tx 317 to the antennas selected by the switch network 307. The T/R switch 313 may be configured for transmit mode operation, and an impedance within the T/R switch 313 in conjunction with the on-chip impedance match block 315A may also provide impedance match to the antennas selected by the switch network 307.

The FM Rx block 319 may be enabled to receive an FM signal that may be received by the internal and/or external antennas selected by the switch network 307. The on-chip impedance matching block 315B may be enabled to match the input impedance of the FM Rx 319 to the antennas selected by the switch network 307. The T/R switch 313 may be enabled to receive mode, and an impedance within the T/R switch 313 in conjunction with the on-chip impedance match block 315B may also provide impedance match with the antennas selected by the switch network 307.

In an embodiment of the invention, the optimum received and/or transmitted signal strength may be determined by enabling various antenna configurations, which may comprise one or more of the external antennas 303A, 303B, 303C, and/or one or more of the internal antennas 305A and 305B, as well as one or more metal components, such as the internal metal component 311.

The strength of the received signal, or received signal strength indicator (RSSI), received by the FM Rx 319 may be stored in a memory, such as the memory 228, described with respect to FIG. 2, may be utilized to determine the optimum antenna configuration. A processor, such as the processor 230, may be utilized to configure the switch network 307 for the multiple antenna configurations and store the measured RSSI values in a memory. Multiple antenna configurations may be assessed to determine the configuration that results in the highest RSSI at a particular frequency. A threshold value may be established from the plurality of RSSI values obtained for the various antenna combinations. In an embodiment of the invention, any antenna configuration that results in a measured RSSI above the threshold may be an acceptable antenna configuration.

By antenna reciprocity, the maximum received signal antenna configuration may also define the maximum transmitted signal antenna configuration. As the optimum antenna configuration may change with variations in the environment and signal frequency, for example, the optimization of the antenna configuration may be performed on a periodic or continual basis. The antennas may be constantly sampled and there may not be any audible effects since the frequency may be outside the 20 kHz bandwidth, and may even be in the MHz range.

In another embodiment of the invention, the plurality of antennas may be utilized to tune the antenna characteristics to a particular frequency range. For example, if two antennas are optimized for 108 MHz and when they may be coupled together, they may be optimized for 76 MHz. They may form a duo band antenna, and by the combination of the two, the range of the antenna may be extended. Since the FM band may comprise a large range, nearly an octave, an antenna may be tuned for the highest frequencies to get the highest gain and then utilize a separate antenna on-chip for that best gain. The two antennae may be combined to result in another size antenna for the frequency range.

Figure 4:
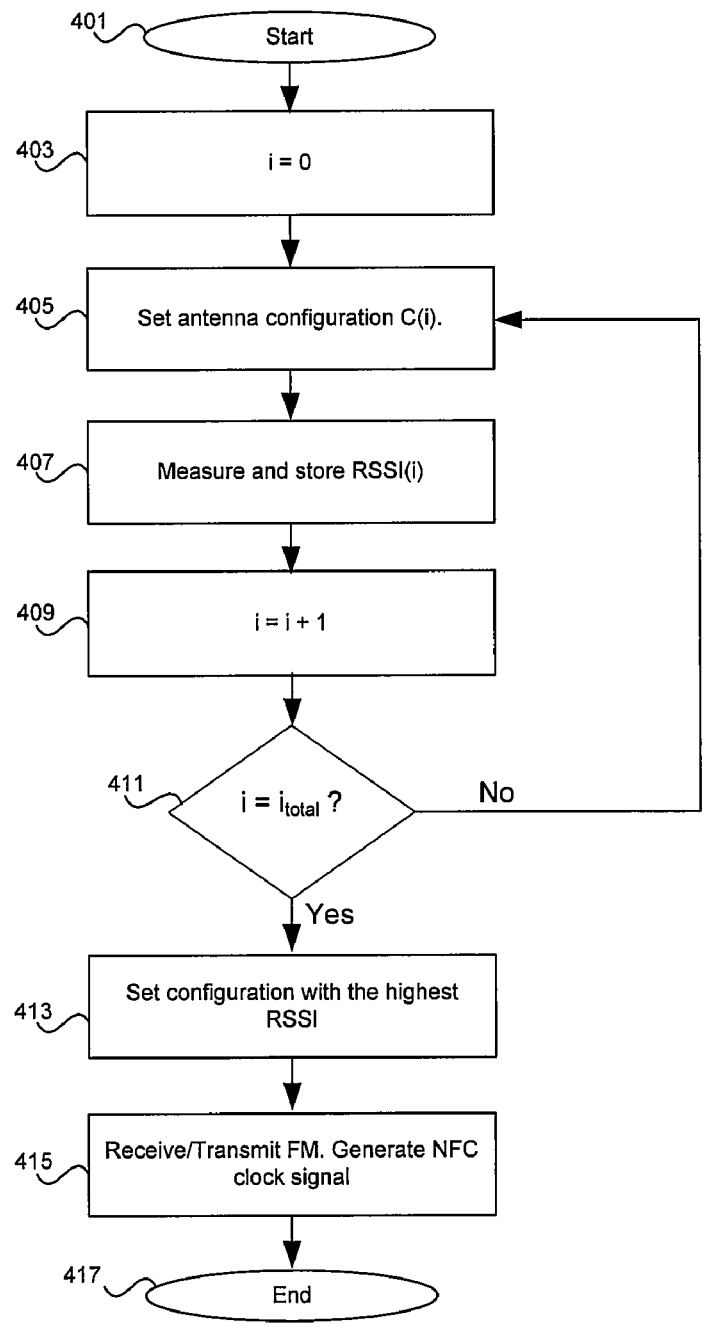
FIG. 4 is a flow diagram illustrating an exemplary antenna configuration process, in accordance with an embodiment of the invention.

FIG. 4 is a flow diagram illustrating an exemplary antenna configuration process, in accordance with an embodiment of the invention. Referring to FIG. 4 after start step 401, in step 403, the variable i may be set to 0. In step 405, the switch network 307 may be enabled to couple an antenna configuration, C(i), where i is the total number of antenna configurations that may be enabled by the switch network 307. In step 407, the RSSI measured for that particular configuration C(i) may be stored in a memory, such as the memory 228 described with respect to FIG. 2. In step 409, the value of i may be incremented by one, and in step 411, if the value of i may not be the maximum number of configurations, the process may jump back to step 405, and repeat through this loop until all desired antenna configurations may be set, measured, and the RSSI value stored. If, in step 411, the value of i may equal the total number of antenna configurations, the process may proceed to step 413, where the configuration which resulted in the highest RSSI may be enabled. The process may then proceed to step 415 where FM signals may be transmitted and/or received utilizing the optimum antenna configuration determined by the highest measured RSSI, followed by end step 417.

In an embodiment of the invention, a method and system are disclosed for optimizing an FM transmitter and FM receiver in a single chip FM transmitter and receiver. Aspects of the invention may comprise receiving an FM signal from each of multiple selected antenna configurations comprising one or more of a plurality of antennas 303A-C and 305A and 305B to the FM receiver 319. The received signal strength obtained for each of the antenna configurations may be measured, and FM signals may be transmitted and/or received utilizing an antenna configuration that generates a received signal strength above a desired threshold from the measurement. The received signal strength for each of the antenna configurations may be stored in the memory 228. The FM transmitter 317 and the FM receiver 319 may be integrated on a chip 309. The FM receiver 319 may be impedance matched to the antenna configurations utilizing selectable capacitors integrated on-chip and/or off-chip and selectable inductors located external to the chip. The plurality of antennas may comprise antennas 305A and 305B that are internal to the wireless device 301 and antennas 303A-C that are external to the wireless device 301, each of which may be tuned for handling one or more of a plurality of wireless protocols. One or more of the plurality of antennas may comprise metal components 311 within and/or part of an enclosure for the wireless device 301.

Certain embodiments of the invention may comprise a machine-readable storage having stored thereon, a computer program having at least one code section for optimizing an FM transmitter and FM receiver in a single chip FM transmitter and FM receiver, the at least one code section being executable by a machine for causing the machine to perform one or more of the steps described herein.

Accordingly, aspects of the invention may be realized in hardware, software, firmware or a combination thereof. The invention may be realized in a centralized fashion in at least one computer system or in a distributed fashion where different elements are spread across several interconnected computer systems. Any kind of computer system or other apparatus adapted for carrying out the methods described herein is suited. A typical combination of hardware, software and firmware may be a general-purpose computer system with a computer program that, when being loaded and executed, controls the computer system such that it carries out the methods described herein.

One embodiment of the present invention may be implemented as a board level product, as a single chip, application specific integrated circuit (ASIC), or with varying levels integrated on a single chip with other portions of the system as separate components. The degree of integration of the system will primarily be determined by speed and cost considerations. Because of the sophisticated nature of modern processors, it is possible to utilize a commercially available processor, which may be implemented external to an ASIC implementation of the present system. Alternatively, if the processor is available as an ASIC core or logic block, then the commercially available processor may be implemented as part of an ASIC device with various functions implemented as firmware.

The present invention may also be embedded in a computer program product, which comprises all the features enabling the implementation of the methods described herein, and which when loaded in a computer system is able to carry out these methods. Computer program in the present context may mean, for example, any expression, in any language, code or notation, of a set of instructions intended to cause a system having an information processing capability to perform a particular function either directly or after either or both of the following: a) conversion to another language, code or notation; b) reproduction in a different material form. However, other meanings of computer program within the understanding of those skilled in the art are also contemplated by the present invention.

While the invention has been described with reference to certain embodiments, it will be understood by those skilled in the art that various changes may be made and equivalents may be substituted without departing from the scope of the present invention. In addition, many modifications may be made to adapt a particular situation or material to the teachings of the present invention without departing from its scope. Therefore, it is intended that the present invention not be limited to the particular embodiments disclosed, but that the present invention will include all embodiments falling within the scope of the appended claims.

What is claimed is:

1. A method for wireless communication, the method comprising:
   in a single wireless device comprising an RF transmitter and an RF receiver integrated within a chip and a switching network configured to selectively couple antennas to the RF transmitter and RF receiver, receiving an RF signal from each of a plurality of different selected antenna configurations integrated in said single wireless device and external to said chip, each of said different selected antenna configurations comprising a plurality of antennas selected by said switching network, said different selected antenna configurations comprising a combination of antennas internal and external to an enclosure of the single wireless device;

measuring a received signal strength of said received RF signal for each of said plurality of different selected antenna configurations;

determining which of said plurality of different selected antenna configurations generates a received signal strength above a desired threshold based on said measuring; and transmitting and/or receiving subsequent RF signals utilizing one of said plurality of different selected antenna configurations that generates a received signal strength above said desired threshold based on said measuring.

2. The method according to claim 1, comprising selectively coupling each of said different selected antenna configurations to said RF receiver for said receiving of said RF signal.

3. The method according to claim 2, wherein said plurality of antennas comprises an internal metal component of said single wireless device.

4. The method according to claim 3, wherein each of said antennas internal to said single wireless device is tuned for handling one or more of a plurality of wireless protocols.

5. The method according to claim 2, wherein said plurality of antennas comprises antennas coupled to said single wireless device.

6. The method according to claim 5, wherein each of said antennas coupled to said single wireless device is tuned for handling one or more of a plurality of wireless protocols.

7. The method according to claim 2, wherein one or more of said plurality of antennas comprises metal components within and/or part of the enclosure for said single wireless device.

8. The method according to claim 1, comprising impedance matching said RF receiver to each of said plurality of different selected antenna configurations.

9. The method according to claim 8, wherein said impedance matching utilizes on-chip and/or off-chip selectable capacitors.

10. The method according to claim 8, wherein said impedance matching utilizes off-chip selectable inductors.

11. The method according to claim 1, comprising storing said received signal strength for each of said plurality of different selected antenna configurations in a memory.

12. A system for wireless communication, the system comprising:

one or more circuits in a single wireless device comprising an RF transmitter and an RF receiver integrated within a chip and a switching network configured to selectively couple antennas to the RF transmitter and RF receiver, said one or more circuits receives an RF signal from each of a plurality of different selected antenna configurations integrated in said single wireless device and external to said chip, each of said different selected antenna configurations comprising a plurality of antennas selected by said switching network, said different selected antenna configurations comprising a combination of antennas internal and external to an enclosure of the single wireless device;

said one or more circuits measures a received signal strength of said received RF signal for each of said plurality of different selected antenna configurations;

said one or more circuits determines which of said plurality of different selected antenna configurations generates a received signal strength above a desired threshold based on said measuring; and said one or more circuits transmits and/or receives subsequent RF signals utilizing one of said plurality of different selected antenna configurations that generates a received signal strength above said desired threshold based on said measuring.

13. The system according to claim 12, wherein said one or more circuits enables selectively coupling each of said different selected antenna configurations to said RF receiver for said receiving of said RF signal.

14. The system according to claim 13, wherein said plurality of antennas comprises an internal metal component of said single wireless device.

15. The system according to claim 14, wherein each of said antennas internal to said single wireless device is tuned for handling one or more of a plurality of wireless protocols.

16. The system according to claim 13, wherein said plurality of antennas comprises antennas coupled to said single wireless device.

17. The system according to claim 16, wherein each of said antennas coupled to said single wireless device is tuned for handling one or more of a plurality of wireless protocols.

18. The system according to claim 13, wherein one or more of said plurality of antennas comprises metal components within and/or part of the enclosure for said single wireless device.

19. The system according to claim 12, wherein said one or more circuits enables impedance matching said RF receiver to each of said plurality of different selected antenna configurations.

20. The system according to claim 19, wherein said one or more circuits comprises on-chip and/or off-chip selectable capacitors for said impedance matching.

21. The system according to claim 19, wherein said one or more circuits comprises off-chip selectable inductors for said impedance matching.

22. The system according to claim 12, wherein said one or more circuits enables storing said received signal strength for each of said plurality of different selected antenna configurations in a memory.

* * * * *